United States Patent [19]
Pinto et al.

[11] Patent Number: 5,933,058
[45] Date of Patent: Aug. 3, 1999

[54] SELF-TUNING CLOCK RECOVERY PHASE-LOCKED LOOP CIRCUIT

[75] Inventors: Victor Pinto, Zichron Yaacov; Neil David Feldman, Haifa; Tzach Hadas, Zichron Yaacov; Yaakov Arie Zandman, Hof Hacarmel, all of Israel

[73] Assignee: Zoran Corporation, Santa Clara, Calif.

[21] Appl. No.: 08/754,856

[22] Filed: Nov. 22, 1996

[51] Int. Cl.[6] .............................. H03L 7/08; H03L 7/099; H03L 7/10; H03L 7/18

[52] U.S. Cl. ................... 331/17; 331/1 A; 331/2; 331/14; 331/10; 331/16; 331/25; 331/18; 331/49; 327/157

[58] Field of Search .................... 331/1 A, 2, 14, 331/16, 17, 18, 25, 44, 49, DIG. 2, 10; 327/147–150, 156–159; 375/376

[56] References Cited

U.S. PATENT DOCUMENTS

| | | | |
|---|---|---|---|
| 3,899,746 | 8/1975 | Gammel | 331/49 |
| 4,980,652 | 12/1990 | Tarusawa et al. | 331/16 X |
| 5,268,654 | 12/1993 | Furutani et al. | 331/16 X |
| 5,272,453 | 12/1993 | Traynor et al. | 331/17 X |
| 5,399,994 | 3/1995 | Siniscalchi et al. | 331/17 |
| 5,436,598 | 7/1995 | Harris | 331/17 X |

OTHER PUBLICATIONS

"Digital Audio Interface," *International Satandard CEI/IEC* 958, Premiere Edition, First Edition, 1989–03, pp. 5–49.
"Digital Audio Interface," *International Standard CEI/IEC* 958, Amendment 1, 1993–02, pp. 3–35.
Brochure entitled: "Six–Channel Dolby Digital Surround Processor (ZR38500)," Zoran Corporation, pp. 1–36 (Feb. 1996).

*Primary Examiner*—David Mis
*Attorney, Agent, or Firm*—Majestic, Parsons, Siebert & Hsue

[57] ABSTRACT

A self-tuning clock recovery phase-locked loop (PLL) includes a programmable divide-by-M, a phase-frequency detector, a programmable voltage-controlled oscillator (VCO), a programmable divide-by-N, and a PLL tuning circuit, which in normal mode operation, perform as a conventional PLL. When the frequency of an input clock signal to the PLL changes by more than a threshold value, however, the PLL tuning circuit causes the PLL to be retuned for the new frequency by adjusting offset and gain parameters in the PLL such that the input voltage to the VCO is mid-way in its input voltage range when the output clock frequency of the PLL is approximately equal to the input clock frequency multiplied by a closed loop gain of the PLL, so that the VCO is operating in a linear region having wide dynamic frequency range.

15 Claims, 12 Drawing Sheets

SELF-TUNING CLOCK RECOVERY PHASE-LOCKED LOOP CIRCUIT

FIELD OF THE INVENTION

This invention relates in general to phase-locked loop circuits and in particular, to a self-tuning clock recovery phase-locked loop circuit.

BACKGROUND OF THE INVENTION

A clock recovery phase-locked loop circuit is employed, for example, in digital audio equipment to generate clock signals useful for extracting audio data from incoming audio signals, and clocking digital-to-analog converters to generate output audio signals after processing. In such and other applications, the incoming signals may be encoded at different and wide ranging sampling rates, presenting stability and/or response time problems for a clock recovery phase-locked loop circuit generating synchronized clock signals from such incoming signals.

There are several digital audio standards in existence. Audio compact disks (CDs) commonly use a sampling rate of 44.1 Khz. Other digital audio standards use sampling rates of 32 Khz, 48 Khz, and 96 Khz. To provide optimal stability and response time, it is desirable to tune a clock recovery phase-locked loop circuit to the sampling rate, or a center frequency within a narrow range including the sampling rate, of the incoming audio signal, so as to operate the clock recovery phase-locked loop circuit in a linear region having wide dynamic output range. Accordingly, in digital audio equipment receiving incoming data signals of such wide ranging sampling rates, a tunable clock recovery phase-locked loop circuit is useful, and a self-tuning clock recovery phase-locked loop circuit is particularly useful.

Tuning a phase-locked loop circuit also commonly requires a stable reference or tuning clock. In digital systems, the system clock is commonly used for this purpose. Accordingly, since system clock frequencies may vary substantially from system to system, it is useful for clock recovery phase-locked loop circuits included in commercially standard integrated circuit devices, to be readily and reliably tunable when used in various systems operating at different system clock frequencies. It is also useful for such clock recovery phase-locked loop circuits to accommodate process variations in their manufacture, and temperature effects in their operation.

OBJECTS AND SUMMARY OF THE INVENTION

Accordingly, one object of the present invention is to provide a tunable clock recovery phase-locked loop circuit adapted to accommodate incoming signals having data encoded with different sampling rates.

Another object is to provide a self-tuning clock recovery phase-locked loop circuit that automatically retunes itself to be operative with incoming signals having data encoded with different sampling rates.

Another object is to provide a self-tuning clock recovery phase-locked loop circuit that operates with system clock signals of different frequencies, and accommodates process variations in their manufacture and temperature effects in their operation.

These and additional objects are accomplished by the various aspects of the present invention, wherein briefly stated, one aspect is a self-tuning phase-locked loop (PLL) circuit which tunes itself, for example, upon receiving a relock signal placed in a relocking mode state. Included in the self-tuning PLL are a divide-by-M circuit, a phase-frequency detector (PFD) circuit, a voltage-controlled oscillator (VCO) circuit, a divide-by-N circuit, and a PLL tuning circuit. The divide-by-M receives an input clock signal having an input clock frequency, and generates a clock signal having a frequency approximately equal to the input clock frequency divided by an M-value preferably stored in an M-register of the divide-by-M circuit. In a similar fashion, the divide-by-N receives an output clock signal having an output clock frequency, and generates a clock signal having a frequency approximately equal to the output clock frequency divided by an N-value preferably stored in an N-register of the divide-by-N circuit. The PFD has a first input receiving the clock signal generated by the divide-by-M, a second input receiving the clock signal generated by the divide-by-N, and an output indicating phase and frequency differences between the received clock signals. The VCO, along with other parts of the self-tuning PLL, is coupled to a power supply providing a supply voltage VCC. The VCO has a voltage input receiving an input voltage VIN from a node, to which, the PFD output is switchably coupled. The VCO also has at least one parameter adjusting input receiving at least one parameter adjusting value, and an output providing the output clock signal such that the output clock frequency is related to the input voltage and the at least one parameter adjusting value. The PLL tuning circuit receives the relock signal, and if the relock signal is in the relocking mode state, causes the PFD output to decouple from the node, and adjusts the at least one parameter adjusting value such that the output clock frequency is approximately equal to the input clock frequency multiplied by a closed loop gain of the self-tuning phase-locked loop circuit when the input voltage is one-half the supply voltage, which corresponds to being mid-way in the input voltage range, so that the VCO is operating in a linear region having wide dynamic frequency range.

Another aspect is a self-tuning clock recovery phase-locked loop circuit coupled to a supply voltage, comprising: a divide-by-M circuit having an input for receiving a reference clock signal, and an output; a phase-frequency detector circuit having a first input, a second input, and an output, wherein the first input is coupled to the divide-by-M circuit output; a voltage-controlled oscillator having a voltage input, a programmable offset input, and an output, wherein the voltage input is switchably coupled to the phase-frequency detector circuit output, and the voltage-controlled oscillator output has a frequency responsive to the voltage input and the programmable offset input; a divide-by-N circuit having an input and an output, the input coupled to the voltage-controlled oscillator output, and the output coupled to the phase-frequency detector second input; means for determining a clock frequency from an incoming data stream; and means for adjusting the voltage-controlled oscillator programmable offset input so that the voltage-controlled oscillator is substantially equal to the determined clock frequency multiplied by a closed loop gain of the phase-locked loop circuit when the voltage-controlled oscillator voltage input is substantially equal to an optimal input voltage for the voltage-controlled oscillator.

Another aspect is a method of tuning a phase-locked loop circuit to recover a clock signal from an incoming data stream. The phase-locked loop circuit includes a voltage-controlled oscillator having a voltage input, at least one adjustable parameter, and an output having a frequency responsive to the voltage input and the at least one adjustable parameter. The method comprises the steps of: determining a clock frequency of the incoming data stream; and adjusting the at least one adjustable parameter of the voltage-controlled oscillator so that when the voltage-controlled oscillator voltage input is substantially at an optimal input voltage, the frequency of the output of the voltage-controlled oscillator is substantially equal to the determined clock frequency multiplied by a closed loop gain of the phase-locked loop circuit.

Another aspect is a method of re-tuning a phase-locked loop circuit to recover a clock signal from an incoming data stream after a frequency of the incoming data stream changes. The phase-locked loop circuit includes a voltage-controlled oscillator having a voltage input, at least one adjustable parameter, and an output having a frequency responsive to the voltage input and the at least one adjustable parameter. The method comprises the steps of: monitoring the incoming data stream to detect a change in the incoming data stream frequency and determine a new frequency from the incoming data stream after the change in frequency; and adjusting the at least one adjustable parameter of the voltage-controlled oscillator so that when the voltage input of the voltage-controlled oscillator is substantially at an optimal input voltage, the frequency of the output of the voltage-controlled oscillator is substantially equal to the determined new frequency multiplied by a closed loop gain of the phase-locked loop circuit.

Yet another aspect is a method of generating a fixed frequency clock signal from a plurality of voltage-controlled oscillators and a system clock signal of known arbitrary frequency. The method comprises the steps of: programming a divide-by-S circuit such that the frequency divisor is approximately equal to the known arbitrary frequency multiplied by a preselected factor; generating a reference clock signal having a frequency substantially proportional to a reciprocal of the preselected factor by providing the system clock signal to an input of the divide-by-S circuit; sequentially calibrating one-at-a-time the plurality of voltage-controlled oscillators with the reference clock signal; and generating the fixed frequency clock signal alternatingly from selected ones, which are not being calibrated at the time, of the plurality of voltage-controlled oscillators.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENTS

In the following examples, the incoming audio data signal is assumed to be encoded in the S/PDIF format (Sony/Philips digital interface) or the substantially identical, IEC-958 consumer format (type II), and sampled at 32 KHZ, 44.1 KHZ, 48 KHZ, or 96 KHz with 64 bits every audio sampling period when audio data is coming in (normal mode). In order to properly extract audio data from such signals, digital audio equipment such as employed, for examples, in audio compact disk (CD), digital direct broadcast satellite (DBS), digital versatile disk (DVD), and cable/modem systems, must quickly determine the sample rate of the incoming data, then adjust to receive the data at that sample rate.

Figure 1:
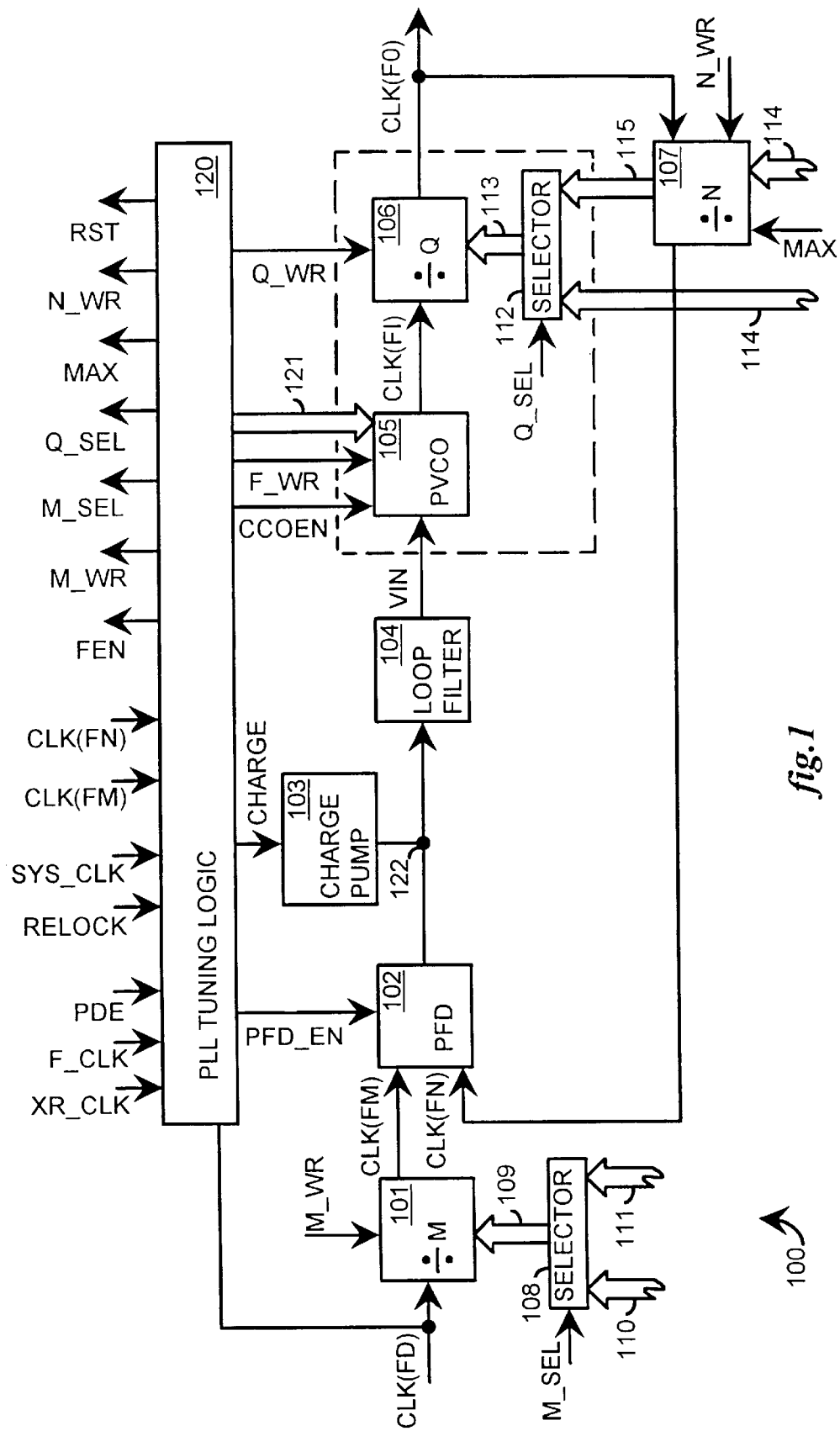
FIG. 1 illustrates, as an example, a block diagram of a self-tuning phase-locked loop circuit, utilizing aspects of the present invention.

FIG. 1 illustrates, as an example, a block diagram of a self-tuning clock recovery phase-locked loop (PLL) circuit 100 which is useful in such digital audio equipment. The self-tuning PLL circuit 100 receives a number of clock and control signals from other circuitry in the digital audio equipment. A system clock signal SYS_CLK is received, which is commonly generated from a clock crystal. An extracted clock signal XR_CLK, a calibrated fixed clock signal F_CLK, and a relocking signal RELOCK are also received, which are generated from other circuitry preferably included with the self-tuning clock recovery PLL 100 on an integrated circuit chip or device in the digital audio equipment. The self-tuning PLL circuit 100 is also coupled to a number of registers and an external memory, which are generally programmed specifically for the digital audio equipment. For example, one register (not shown) coupled to data lines 110 stores the normal operating mode M-value for the frequency divisor of a divide-by-M circuit 101. Another register (not shown) coupled to data lines 111 stores a number equal to a rounded-off product of the system clock frequency times 128 in MHz. A look-up table (LUT) included in an external memory (not shown) coupled to data lines 114, stores tuning data for the divide-by-Q and divide-by-N circuits, 106 and 107. A register also included the external memory (not shown) coupled to data lines 114, stores the normal operating mode N-value for the frequency divisor of a divide-by-N circuit 107.

In normal mode operation, the self-tuning phase-locked loop circuit 100 operates in a conventional fashion to generate an output clock signal CLK(F0) having an output clock frequency F0, which is exactly synchronized with an input clock signal CLK(FD) having an input clock frequency FD, so that the output clock frequency F0 is approximately equal to the input clock frequency FD times the ratio (N/M), which is the closed loop gain of the self-tuning phase-locked loop circuit 100. In such normal mode operation, the extracted clock signal XR_CLK is provided by PLL tuning logic 120 to the input of the divide-by-M circuit 101 as the input clock signal CLK(FD). In the present example, the M-value is equal to the value "1" so that the frequency of the clock signal CLK(FM) coming out of the divide-by-M 101 is the same as the frequency of the input clock signal CLK(FD). The N-value, on the other hand, is equal to a sampling rate required for clocking an audio DAC in the digital audio equipment. Typical N-values are "4" and "6" so that the frequency (F0) or sampling rate of the output clock signal CLK(F0) is 4 or 6 times the frequency (FD) or sampling rate of the input clock signal CLK(FD). The output clock signal CLK(F0) is thereupon used for clocking the audio DAC, and another clock signal used for extracting data from the incoming SPDIF audio signal is preferably generated from the output clock signal CLK(F0) so as to have a frequency which is 2 times the frequency (FD) of the input clock signal CLK(FD), and a phase lagging that of the input clock signal CLK(FD) by approximately 90 degrees (for extracting biphase mark encoded data).

Figure 2A:
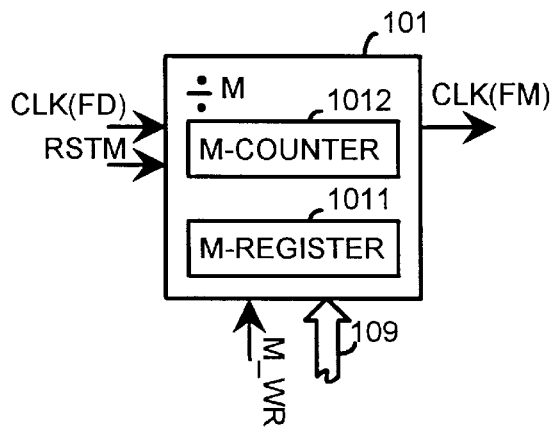
FIGS. 2a–2c illustrate, as examples, block diagrams of the programmable frequency dividers of the self-tuning phase-locked loop circuit of FIG. 1, utilizing aspects of the present invention.
Figure 2B:
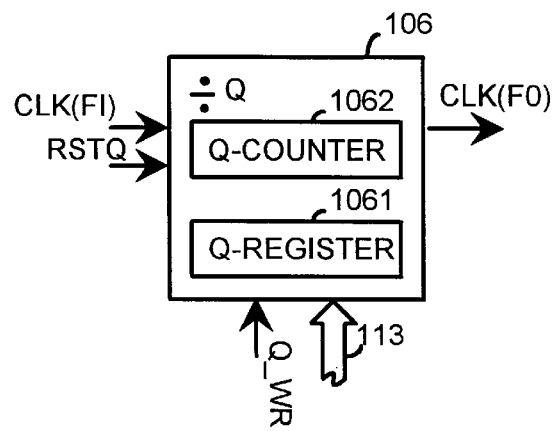
Figure 2C:
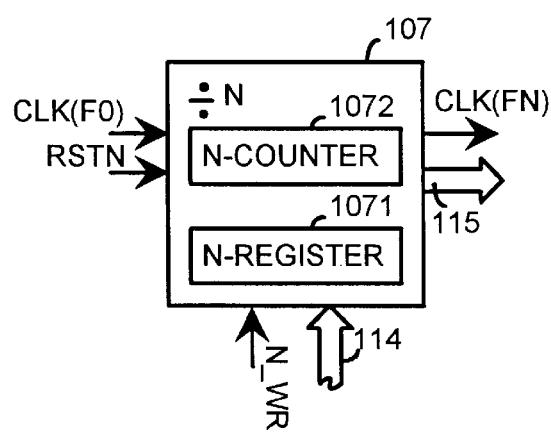

The programmable frequency dividers 101, 106 and 107, as depicted respectively in FIGS. 2a–2c, are conventionally constructed to include a register and a counter. The register stores a value programmed into the register by providing the value on corresponding data lines while enabling a register enable line coupled to the register. The counter receives an input clock signal and counts rising edges of the input clock signal. When the count reaches the programmed value stored in the register, the counter generates a rising edge on its output clock signal, thereby performing the frequency divider function. The count on the counter may generally be read at any time. The count on the counter may also be reset at any time by enabling a counter reset line coupled to the counter. As an example, the programmable divide-by-N 107 includes an N-register 1071 and an N-counter 1072. A value "N" (i.e., N-value) may be stored in the N-register 1071 by providing the value "N" on the data lines 114 while enabling an N-register enable line N_WR. The clock signal CLK(F0) is provided to a clock input of the N-counter 1072, which counts rising edges of the clock signal CLK(F0) until the value "N" is reached, at which time, a rising edge pulse is generated on the clock signal CLK(FN) so that the frequency FN of the clock signal CLK(FN) is approximately equal to the frequency (F0) divided by the value "N". The count on the N-counter 1072 may be read at any time on data lines 115, and reset by enabling an N-counter reset line RSTN. The programmable divide-by-Q 106 and programmable divide-by-M 101 have similarly performing components, and enable and reset lines.

Phase-frequency detector 102 is conventionally constructed and operated, having a first input receiving a clock signal CLK(FM) generated by the programmable divide-by-M 101, a second input receiving a clock signal CLK(FN) generated by the programmable divide-by-N 107, and an output indicative of phase and frequency differences between the two received clock signals. The output of the phase-frequency detector 102 is tri-stated so that the output floats when a control signal PFD_EN is deactivated or disabled. By floating the output, the phase-frequency detector 102 is effectively disabled by decoupling it from a node 122, thereby breaking the forward path of self-tuning clock recovery phase-locked loop circuit 100. The low-pass or loop filter 104 is conventionally constructed and operated to provide stability to the self-tuning phase-locked loop circuit 100.

Figure 3:
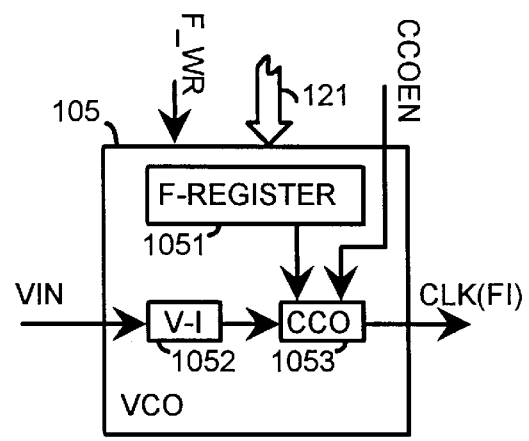
FIG. 3 illustrates, as an example, a block diagram of the programmable VCO of the self-tuning phase-locked loop circuit of FIG. 1, utilizing aspects of the present invention.

The programmable voltage-controlled oscillator (VCO) 105 has an input coupled to the output of the low-pass filter 104, and an output providing an interim clock signal CLK (FI). As depicted in FIG. 3, the programmable VCO 105 includes an F-register 1051, a voltage-to-current converter (V-I) 1052, and a current-controlled oscillator (CCO) 1053, coupled together such that the frequency (FI) of the clock signal CLK(FI) varies with the input voltage VIN to the programmable VCO 105. A frequency offset parameter (FC) is stored in the F-register 1051 by enabling an F-register enable line FRE while providing the offset parameter (FC) on data lines 121.

The programmable VCO 105 in conjunction with the divide-by-Q 106 provide at the output of the self-tuning clock recovery phase-locked loop circuit 100, the clock signal CLK(F0) having a frequency (F0) approximated by the following equation:

$$F0 = (FC + (K \times VIN)) \times (1/Q) \qquad (1)$$

where, FC=the programmable offset parameter stored in the F-register 1051;

K=a gain of the VCO 105;

VIN=the input voltage to the VCO 105; and

Q=the "Q" value stored in the Q-register 1061 of the divide-by-Q 106.

For convenience, the divide-by-Q 106 may also be considered to be a part of the programmable VCO 105, as indicated by the dotted line box encircling the two components.

During tuning mode operation, as initiated by the relock signal being placed in the relocking mode state, charge pump 103 acts as a voltage adjust circuit to charge up or down as appropriate, a voltage on the node 122. For optimal performance of the self-tuning phase-locked loop circuit 100, it is desirable that the input voltage VIN to the programmable voltage-controlled oscillator 105 be at midpoint of its input voltage range when the output frequency F0 is stabilized at its proper value during normal mode operation. This allows the programmable voltage-controlled oscillator 105 and consequently, the self-tuning phase-locked loop circuit 100 to operate near its most linear region, thus providing enhanced control characteristics, and also allows maximum range in either direction to quickly adjust to input clock signal CLK(FD) frequency perturbations. Since the input voltage range typically extends from 0 volts up to a supply voltage VCC provided by a power source to the programmable voltage-controlled oscillator 105, the optimal input voltage is thus generally equal to VCC/2. In addition to the input voltage VIN being at midpoint of its input voltage range when the output frequency F0 is stabilized at its proper value during normal mode operation, it is also desirable that the output frequency range of the combination of the programmable voltage-controlled oscillator 105 and divide-by-Q circuit 106, be centered around the output frequency F0. The PLL tuning logic 120 performs such function by appropriately adjusting the voltage on node 122, the programmable offset parameter FC stored in the F-register 1051, and the Q-value stored in the Q-register 1061 of the divide-by-Q 106 during tuning mode operation.

Figure 4:
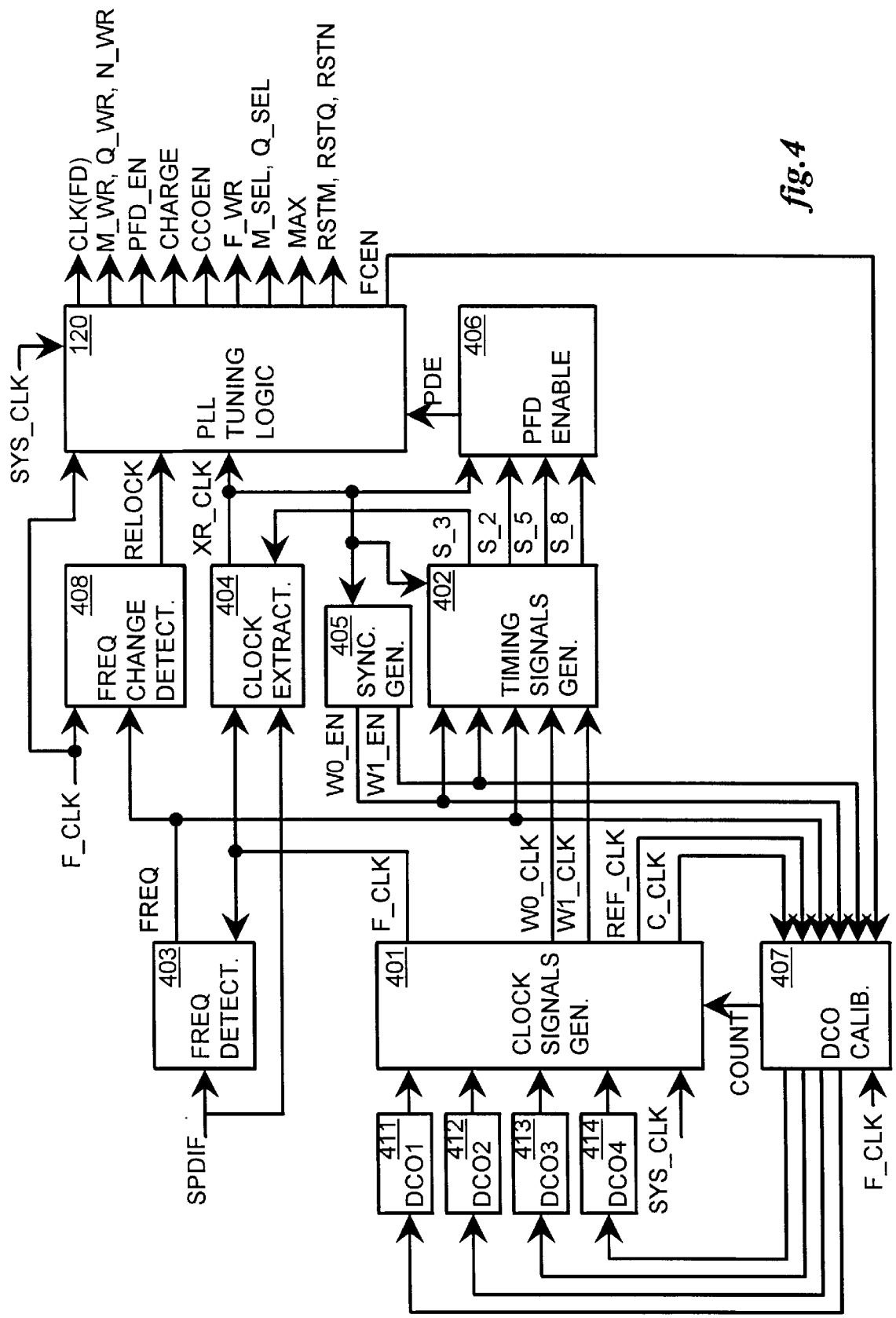
FIG. 4 illustrates, as an example, a block diagram of the PLL controller included in the self-tuning PLL circuit of FIG. 1, utilizing aspects of the present invention.

FIG. 4 illustrates, as an example, a block diagram including the PLL tuning logic 120, and certain phase-locked loop related circuitry which cooperate to provide the clock and control signals for the PLL tuning logic 120. Some of the circuitry depicted therein, such as the frequency detector 403, clock extractor 404, and phase-frequency detector enable 406 are conventionally constructed and operated. Consequently, examples implementing such circuitry are presented, but are not elaborated upon in detail. Other circuitry, on the other hand, such as digital-controlled oscillators (DCOS) 411–414, DCO calibrator 407, clock signals generator 401, and frequency change detector 408 are somewhat unique in their operation, and therefore, examples describing such are presented in appropriate detail.

As a preliminary matter, a digital-controlled oscillator (DCO) as used herein, is understood to be constructed in a similar manner as the voltage-controlled oscillator 105, with the exceptions that a voltage-to-current circuit (e.g., 1052) is not included, and a fixed bias current is provided to the input of the current-controlled oscillator (e.g., 1052) so that a clock signal having a target period results when there is no offset bias in the F-register (e.g., 1051). The frequency and period of the clock signal generated by the DCO may thereupon be changed by adjusting the offset bias stored in the F-register of the DCO.

Four programmable DCOs 411–414 are thus configured to each provide a clock signal having a target period of 8.133 nanoseconds. On a rotating basis, three of the DCO clock signals are used by circuitry in FIG. 4, while the fourth is being calibrated. Employment of the four programmable DCOS 411–414 in this manner, allows each of the four programmable DCOs 411–414 to be periodically calibrated so that their output clock signals remain as close as possible, to having the target period of 8.133 nanoseconds, despite temperature changes in their operation, or process variations in their manufacture.

Figure 5:
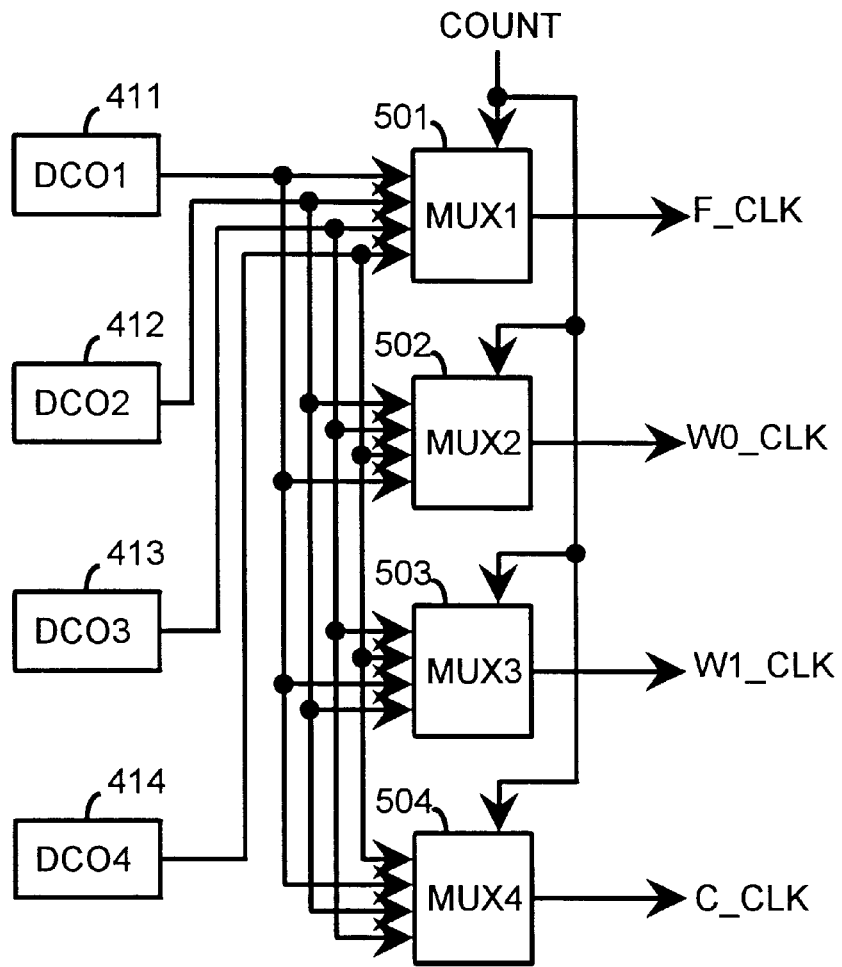
FIG. 5 illustrates, as an example, a block diagram of the clock signals generator included in the PLL controller of FIG. 4, utilizing aspects of the present invention.
Figure 5:
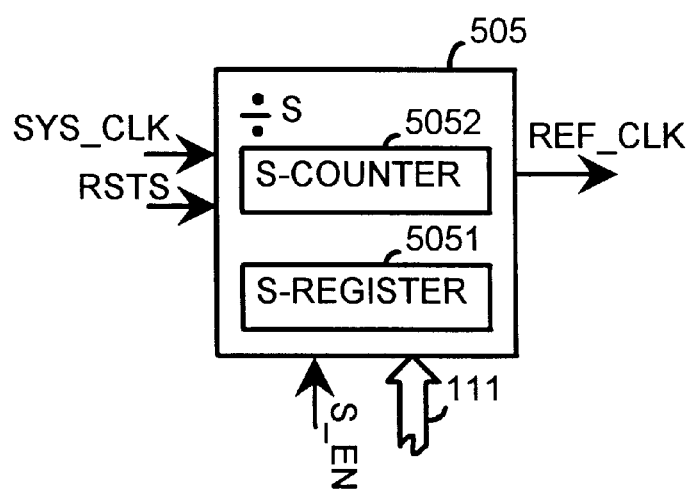

The clock signals generator 401, as depicted in FIG. 5, includes a programmable divide-by-S (÷S) 505, and four multiplexer circuits 501–504. The function of the programmable divide-by-S 504 is to generate a reference clock signal REF_CLK having a frequency of (1/128) MHz, independent of the frequency of the system clock signal SYS_CLK. This function is useful so that the self-tuning phase-locked loop circuit 100 can be implemented in a standard integrated circuit chip which in turn, may be used in various digital audio equipment operating with different system clock frequencies. To accomplish such function, an S-register 5051 of the divide-by-S 505 is programmed to store a value equal to 128 times the system clock frequency in MHz. An S-counter 5052 of the divide-by-S 505 thereupon performs the divide-by-S function on the system clock signal SYS_CLK, resulting in the reference clock signal REF_CLK having the frequency of (1/128) MHz. Programming of the divide-by-S 505 is accomplished in the same fashion as described in reference to the divide-by-M 101, the divide-by-Q 106, and the divide-by-N 107.

Each of the three multiplexer circuits 501–504 preferably receives all four DCO clock signals from the four programmable DCOs 411–414, and passes a selected one of the DCO clock signals to their respective outputs depending upon a 2-bit COUNT value provided to their respective select inputs. For example, if the 2-bit COUNT value is 00, multiplexer circuit 501 passes the clock signal from DCO 411 as its output clock signal F_CLK, multiplexer circuit 502 passes the clock signal from DCO 412 as its output clock signal W0_CLK, multiplexer 503 passes the clock signal from DCO 413 as its output clock signal W1_CLK, and multiplexer circuit 504 passes the clock signal from DCO 414 as its output clock signal C_CLK. On the other hand, if the 2-bit COUNT value is 01, multiplexer circuit 501 passes the clock signal from DCO 412 as its output clock signal F_CLK, multiplexer circuit 502 passes the clock signal from DCO 413 as its output clock signal W0_CLK, multiplexer 503 passes the clock signal from DCO 414 as its output clock signal W1_CLK, and multiplexer circuit 504 passes the clock signal from DCO 411 as its output clock signal C_CLK. In a similar manner, clock signals being passed by the multiplexer circuits 501–504 for 2-bit COUNT values 10 and 11, are also readily determined by inspection of FIG. 5. In addition to the sequence depicted by the connections between the DCOs 411–414 and the multiplexer circuits 501–504 in FIG. 5, other sequences are also readily envisioned by appropriate changes in the connections between the DCOs 411–414 and the multiplexer circuits 501–504.

Figure 11:
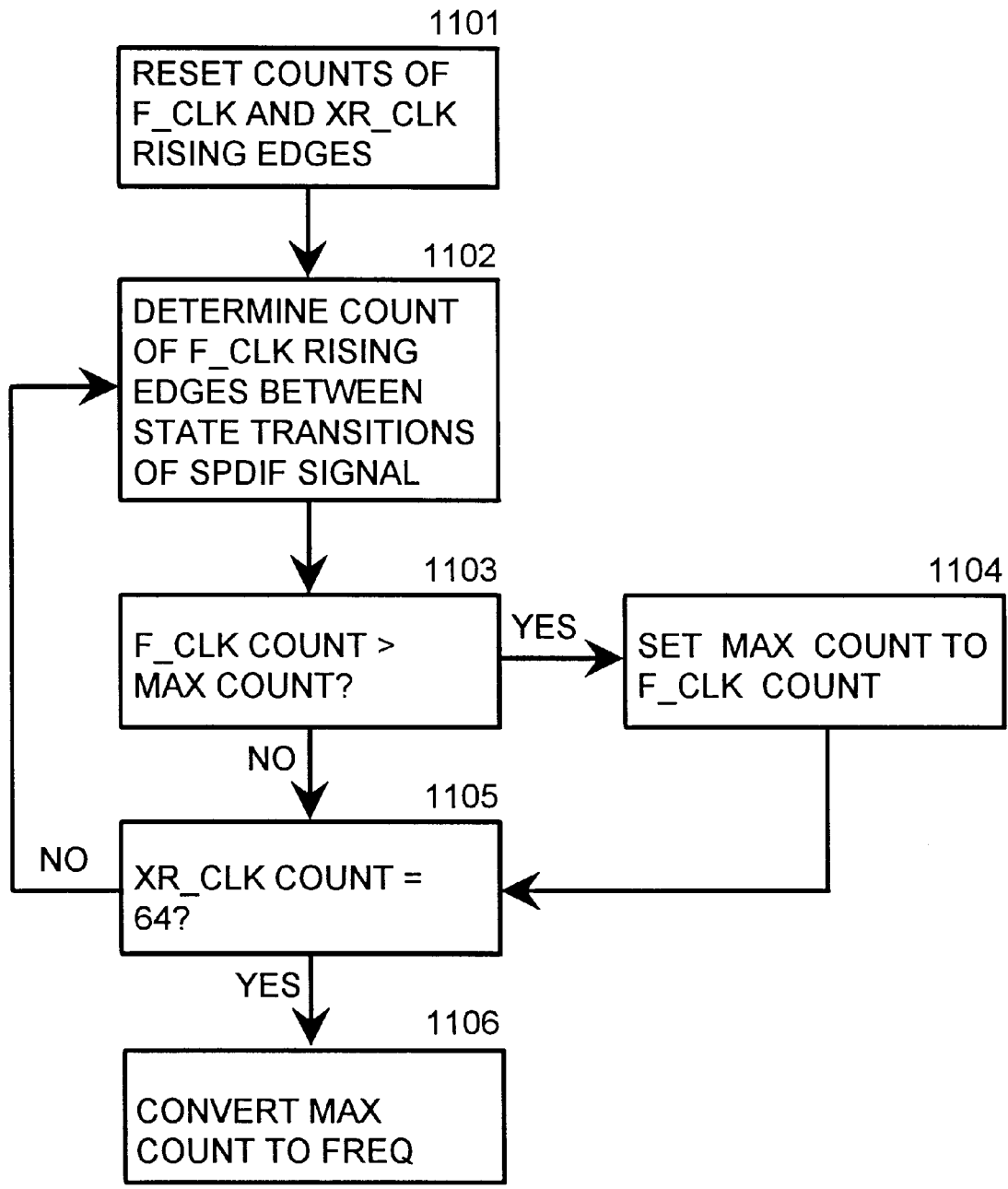
FIG. 11 illustrates, as an example, a flow diagram of a process utilizing aspects of the present invention for determining a frequency from the SPDIF audio data signal.

The frequency detector 403 is preferably implemented as a state machine running with the clock signal F_CLK, and detects the frequency (FD) of the incoming SPDIF audio data signal according to a process described in reference to FIG. 11. Referring to FIG. 11, in a first step 1101, the frequency detector 403 effectively clears the contents of a maximum count register, clears the count of an F_CLK counter counting rising edges on the clock signal F_CLK, and clears the count of an XR_CLK counter counting rising edges on the clock signal XR_CLK. In a second step 1102, the frequency detector 403 causes the F_CLK counter to reset each time a state transition occurs on the incoming audio data signal SPDIF, and stores the count of the F_CLK counter just prior to the reset in a temporary register. Concurrently, the XR_CLK counter is counting rising edges on the clock signal XR_CLK. In a third step 1103, if the count stored in the temporary register is greater than a count value stored in the maximum count register, then in a fourth step 1104, the count stored in the temporary register replaces the count value stored in the maximum count register. In a fifth step 1105, if the count of the XR_CLK counter equals 64, then a sixth step 1106 is performed, otherwise, steps 1102–1105 are repeated.

In the sixth step 1106, the count stored in the maximum count register is converted to a frequency by comparing it against four threshold levels. The four threshold levels arise, because the incoming audio data signal, in this example, must correspond to only one of the following five frequencies: DC (no data being transmitted at the time), 2.048 MHz (32 Khz sampling rate with 64 bits every audio sampling period in normal mode), 2.8224 MHz (44.1 Khz sampling rate with 64 bits every audio sampling period in normal mode), 3.072 MHz (48 Khz sampling rate with 64 bits every audio sampling period in normal mode), or 6.144 MHz (96 Khz sampling rate with 64 bits every audio sampling period in normal mode). The count can be converted to a frequency, because the preamble of each record transmitted in the SPDIF audio data signal includes an initial portion having a constant value over 1.5 sampling rate periods (3/2TD) for synchronization purposes. Since it is known that this 3/2TD period is the longest period of time that the SPDIF audio data signal remains at the same level, and it can be assumed that at least one preamble will occur within 64 rising edges of the extracted clock signal XR_CLK, the count stored in the maximum count register after 64 rising edges of the extracted clock signal XR_CLK is related to the frequency of the incoming audio data signal by the following equation:

$$FD=(64\times\tfrac{1}{2})/(\text{MAX COUNT}\times 8.133\text{ nS}) \qquad (2)$$

wherein the factor of 64 arises, because each audio data sample is taken with 64 bits every audio sampling period in normal mode.

To avoid such calculation, however, the count stored in the maximum count register (i.e., the term MAX COUNT in the above equation) is compared against four precalculated threshold values in the following manner:

(a) if the MAX COUNT is less than 45, then the frequency FD of the incoming SPDIF audio data stream is determined to be 6.144 MHz (96 Khz sampling rate 64 bits every audio sampling period in normal mode), and the 2 bits FREQ are set, for example, to 11;

(b) if the MAX COUNT is greater than or equal to 45, but less than 78, then the frequency FD of the incoming SPDIF audio data stream is determined to be either 2.8224 MHz (44.1 Khz sampling rate 64 bits every audio sampling period in normal mode) or 3.072 MHz (48 Khz sampling rate 64 bits every audio sampling period in normal mode), and the 2 bits FREQ are set, for example, to 10;

(c) if the MAX COUNT is greater than or equal to 78, but less than 96, then the frequency FD of the incoming SPDIF audio data stream is determined to be 2.048 MHz (32 Khz sampling rate 64 bits every audio sampling period in normal mode), and the 2 bits FREQ are set, for example, to 01; and (d) if the MAX COUNT is greater than 96, then the frequency FD of the incoming SPDIF audio data stream is determined to be DC, and the 2 bits FREQ are set, for example, to 00. In this last case, where the frequency FD changes to DC (0 Hz), a zero frequency signal is activated to indicate to other circuitry of the digital audio equipment that data is not coming in at the time. Subsequently, after data is determined to be coming in again by the frequency FD being one of the frequencies 2.048 MHz, 2.8224 MHz, 3.072 MHz, or 6.144 MHz, then the zero frequency signal is deactivated to indicate to other circuitry of the digital audio equipment that data is coming in at the time, and a relocking signal is activated (i.e., placed in a relocking mode state) to inform the PLL tuning logic 120 to retune the self-tuning phase-locked loop circuit 100 to the new frequency FD.

Figure 6:
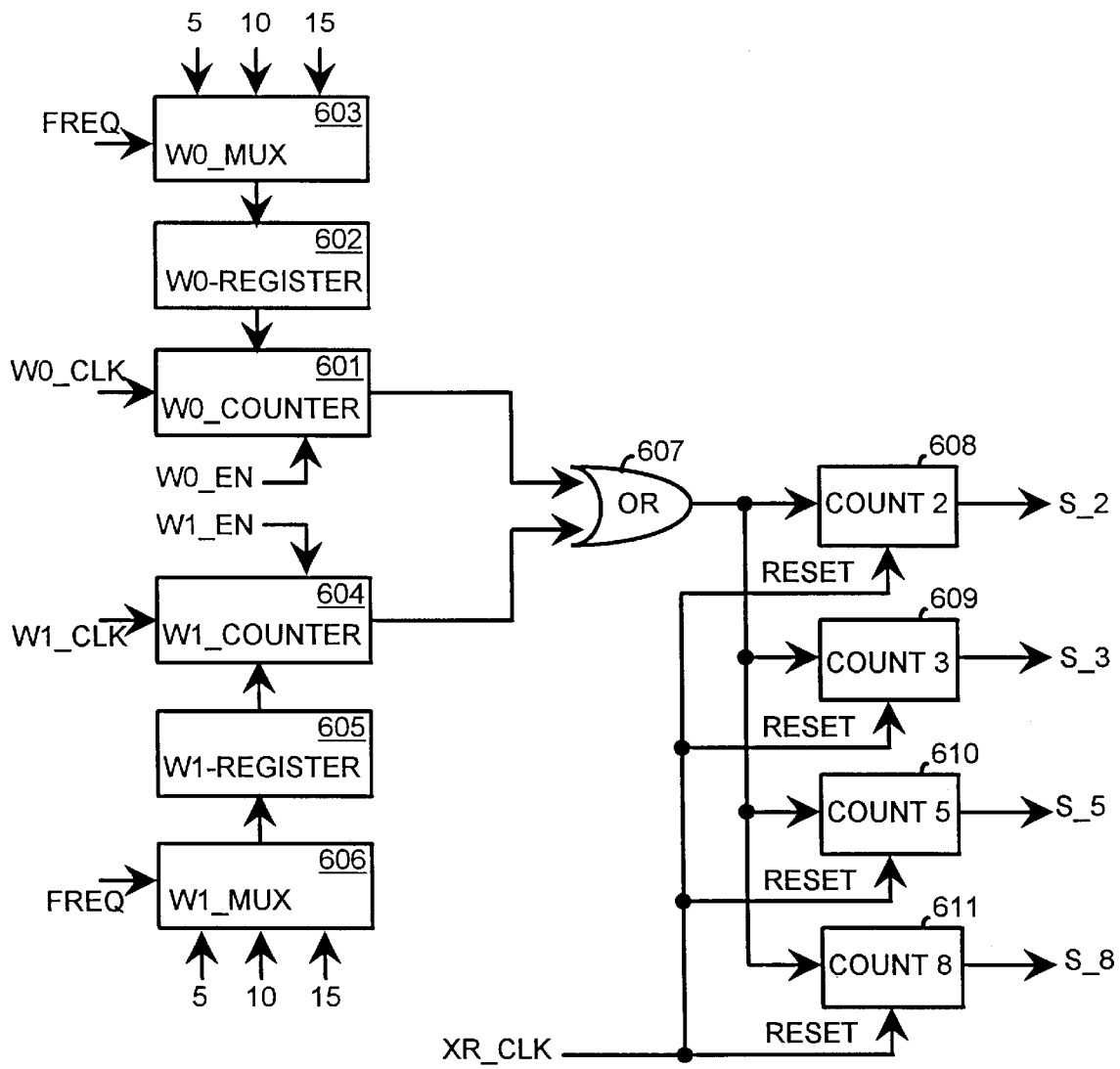
FIG. 6 illustrates, as an example, a block diagram of the timing signals generator included in the PLL controller of FIG. 4, utilizing aspects of the present invention.

The timing signals generator 402, as depicted in FIG. 6, includes a counter (W0_COUNTER) 601 having a clock input coupled to the clock signal W0_CLK for counting rising edges of the clock signal W0_CLK, an enable input coupled to an enable signal W0_EN generated by the synch generator 405, and an output provided to a first input of an OR gate 607. Also included are a register (W0_REGISTER) 602 for programming the upper limit count of the counter 601, and a multiplexer circuit (W0_MUX) 603 for passing one of the decimal values 5, 10 or 15 to be stored in binary form in the register 602, in response to the 2 bits FREQ set by the frequency detector 403.

Also included is a counter (W1_COUNTER) 604 having a clock input coupled to the clock signal W1_CLK for counting rising edges of the clock signal W1_CLK, an enable input coupled to an enable signal W1_EN generated by the synch generator 405, and an output provided to a second input of the OR gate 607. Also included are a register (W1_REGISTER) 605 for programming the upper limit count of the counter 604, and a multiplexer circuit (W1_MUX) 606 for passing one of the decimal values 5, 10 or 15 to be stored in binary form in the register 604, in response to the 2 bits FREQ set by the frequency detector 403.

An output of the OR gate 607 is thereupon provided to each of four counters. A first counter 608 is a conventionally count-to-2 counter which generates a timing signal S_2, a second counter 609 is a conventional count-to-3 counter which generates a timing signal S_3, a third counter 610 is a conventional count-to-5 counter which generates a timing signal S_5, and a fourth counter is a conventional count-to-8 counter which generates a timing signal S_8. Each of the counters 608–611 is reset by the extracted clock signal XR_CLK generated by the clock signal extractor 404.

When the 2 bits FREQ are set at 01 indicating a frequency FD of 2.048 MHz (32 Khz sampling rate with 64 bits every sampling period during normal mode), the multiplexer circuits 603 and 606 pass the decimal value 15 to be stored in binary form in the registers 602 and 605. On the other hand, when the 2 bits FREQ are set at 10 indicating a frequency FD of either 2.8224 MHz (44.1 Khz sampling rate with 64 bits every sampling period during normal mode) or 3.072 MHz (48 Khz sampling rate with 64 bits every sampling period during normal mode), the multiplexer circuits 603 and 606 pass the decimal value 10 to be stored in binary form in the registers 602 and 605. Finally, when the 2 bits FREQ are set at 11 indicating a frequency FD of 6.144 MHz (96 Khz sampling rate with 64 bits every sampling period during normal mode), the multiplexer circuits 603 and 606 pass the decimal value 5 to be stored in binary form in the registers 602 and 605.

The counters 601 and 604 are enabled by alternatingly activating enable lines W0_EN and W1_EN so that when one of the counters is being used, the other is not being used. As a result, the counters 601 and 604 alternatingly generate output pulses after counting up to the upper count limit stored in their respective registers 602 and 605 so that a clock signal having a pulse period of 122.0 ns (15*8.133 nanoseconds) and a frequency of 8.2 MHz, or approximately four times the detected frequency FD, is generated at the output of the OR gate 607 when the detected frequency FD is 2.048 MHz. Also, a pulse period of 81.3 ns (10*8.133 nanoseconds) and a frequency of 12.3 MHz, or approximately four times the detected frequency FD, is generated at the output of the OR gate 607 when the detected frequency FD is either 2.8224 MHz or 3.072 MHz. Similarly, a pulse period of 40.7 ns (5*8.133 nanoseconds) and a frequency of 24.6 MHz, or approximately four times the detected frequency FD, is generated at the output of the OR gate 607 when the detected frequency FD is 6.144 MHz.

Since the clock signal output of the OR gate 607 is always approximately four times the frequency of the detected frequency FD of the SPDIF audio data signal, four pulses are always generated during each time period TD of the SPDIF audio data signal. Since the counter 608 is reset by the extracted clock signal XR_CLK, and counts 2 pulses of the output of the OR gate 607 before generating a rising edge pulse, it generates a timing signal S_2 which is delayed one-half period (i.e., TD/2) relative to the extracted clock signal XR_CLK. Similarly, since the counter 609 is reset by the extracted clock signal XR_CLK, and counts 3 pulses of the output of the OR gate 607 before generating a rising edge pulse, it generates a timing signal S_3 which is delayed three-fourth a period (i.e., 3TD/4) relative to the extracted clock signal XR_CLK.

Since the counter 610 is reset by the extracted clock signal XR_CLK, and counts 5 pulses of the output of the OR gate 607 before generating a rising edge pulse, it generates a timing signal S_5 which is always zero during data reading mode, since rising edge pulses of the extracted clock signal XR_CLK occur every four pulses on the output of the OR gate 607. During preamble reading mode, however, six pulses on the output of the OR gate 607 occur between the first two rising edge pulses of the extracted clock signal XR_CLK (see, e.g., FIG. 15 at times t5 and tc) and as a consequence, a pulse occurs on the timing signal S_5, which can be used as a preamble detection indicator to cause the phase-frequency detector 102 to be disabled during the preamble reading period.

Similarly, since the counter 611 is reset by the extracted clock signal XR_CLK, and counts 8 pulses of the output of the OR gate 607 before generating a rising edge pulse, it generates a timing signal S_8 which is always zero during data reading mode, since rising edge pulses of the extracted clock signal XR_CLK occur every four pulses on the output of the OR gate 607. During preamble reading mode, however, ten pulses on the output of the OR gate 607 occur between the last two rising edge pulses of the extracted clock signal XR_CLK (see, e.g., FIG. 15 at times tc and t9) and as a consequence, a pulse occurs on the timing signal S_8, which can be used as a preamble ending indicator to cause the phase-frequency detector 102 to be enabled again in preparation for a data reading period. To accomplish the above, the extracted clock signal XR_CLK is forced during a time initiated by the first rising edge of the timing signal S_2 after a rising edge on the timing signal S_5 indicates a preamble, until a first rising edge on the timing signal S_8 indicates the end of the preamble (e.g., between times t7 and te in FIG. 15) by circuitry (not shown) included in the digital audio equipment which overrides the clock signal extractor 404 during this period.

Figure 7:
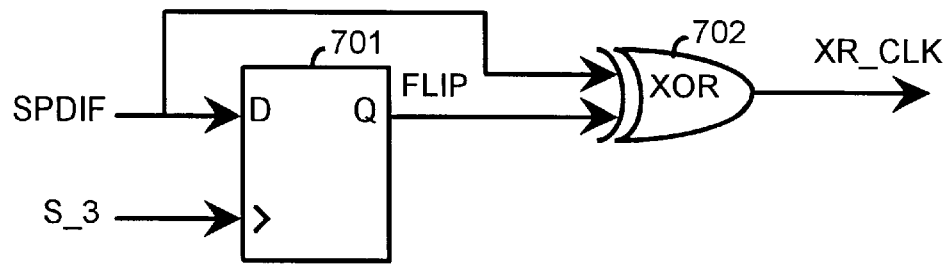
FIG. 7 illustrates, as an example, a logic diagram of the clock signal extractor included in the PLL controller of FIG. 4, utilizing aspects of the present invention.

The clock signal extractor 404, as depicted in FIG. 7, includes a D flip-flop 701, and an exclusive-OR 702. The D flip-flop 701 has a D-input coupled to the SPDIF audio data signal, a clock input coupled to the timing signal S_3 generated by the timing signals generator 402, and a Q-output providing a FLIP signal. The exclusive-OR 702 has a first input coupled to the SPDIF audio data signal, a second input coupled to the FLIP signal generated by the D flip-flop 701, and an output providing the extracted clock signal XR_CLK.

Figure 8:
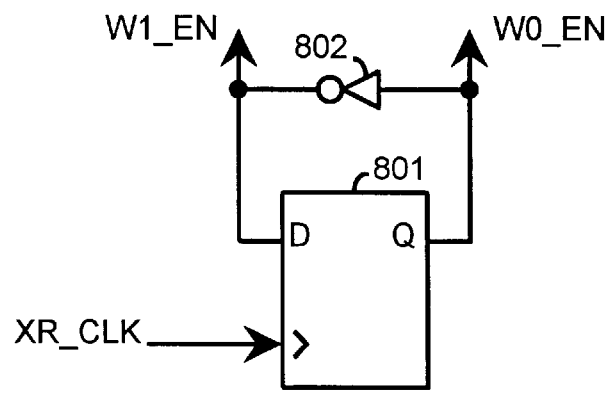
FIG. 8 illustrates, as an example, a logic diagram of the synch generator included in the PLL controller of FIG. 4, utilizing aspects of the present invention.

The synch generator 405, as depicted in FIG. 8, includes a D flip-flop 801, and an inverter 802. The D flip-flop 801 has a clock input coupled to the extracted clock signal XR_CLK generated by the clock signal extractor 404. The inverter 802 has an input coupled to the Q-output of the D flip-flop 801, and an output coupled to the D-input of the D flip-flop 801. Since the Q-output of the D flip-flop 801 is coupled to the enable line W0_EN, and the D-input of the D flip-flop 801 is coupled to the enable line W1_EN, the inverter feedback causes the enable lines W0_EN and W1_EN to alternately be activated and deactivated each rising edge of the extracted clock signal XR_CLK. In addition, since the enable lines W0_EN and W1_EN are activated by rising edges of the extracted clock signal XR_CLK, this causes the clock signal outputs of the counters 601 and 604, and the timing signals S_2, S_3, S_5, and S_5 to be synchronized with the extracted clock signal XR_CLK.

Figure 9:
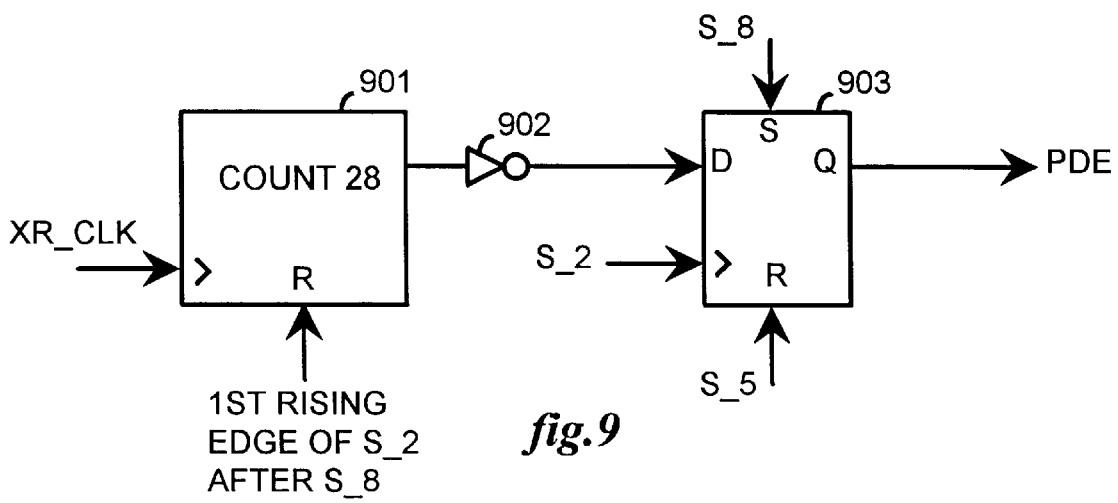
FIG. 9 illustrates, as an example, a logic diagram of the phase-frequency detector enable signal generator included in the PLL controller of FIG. 4, utilizing aspects of the present invention.

The phase-frequency detector enable signal generator 406, as depicted in FIG. 9, includes a count-to-28 counter 901, an inverter 902, and a set-resettable D flip-flop 903. The count-to-28 counter 901 receives the extracted clock signal XR_CLK, and counts 28 rising edges of the extracted clock signal XR_CLK before generating a rising edge pulse on its output. This is the number of periods required for reading a record of data from the SPDIF audio data signal. The count-to-28 counter 901 is reset by the first rising edge of the timing signal S_2 after a rising edge on the timing signal S_8, to indicate that a new record of data from the SPDIF audio data signal is to be read. The inverter 902 is coupled between the output of the count-to-28 counter 901 and a D-input of the set-resettable D flip-flop 903. The timing signal S_2 is coupled to a clock input, the timing signal S_5 is coupled to a reset input, and the timing signal S_8 is coupled to a set input of the set-resettable D flip-flop 903. Consequently, a phase-frequency detector enable signal PDE is generated at a Q-output of the set-resettable D flip-flop 903, which is active during the 28 periods of TD during which data is to be read, thereby enabling the self-tuning phase-locked loop circuit 100. Subsequently, the phase-frequency detector enable signal PDE is placed in a deactivated state by the timing signal S_5 resetting the flip-flop 903 after detecting a preamble on the incoming audio data signal, and then set again to the active state by the timing signal S_8 indicating the end of the detected preamble.

Figure 10:
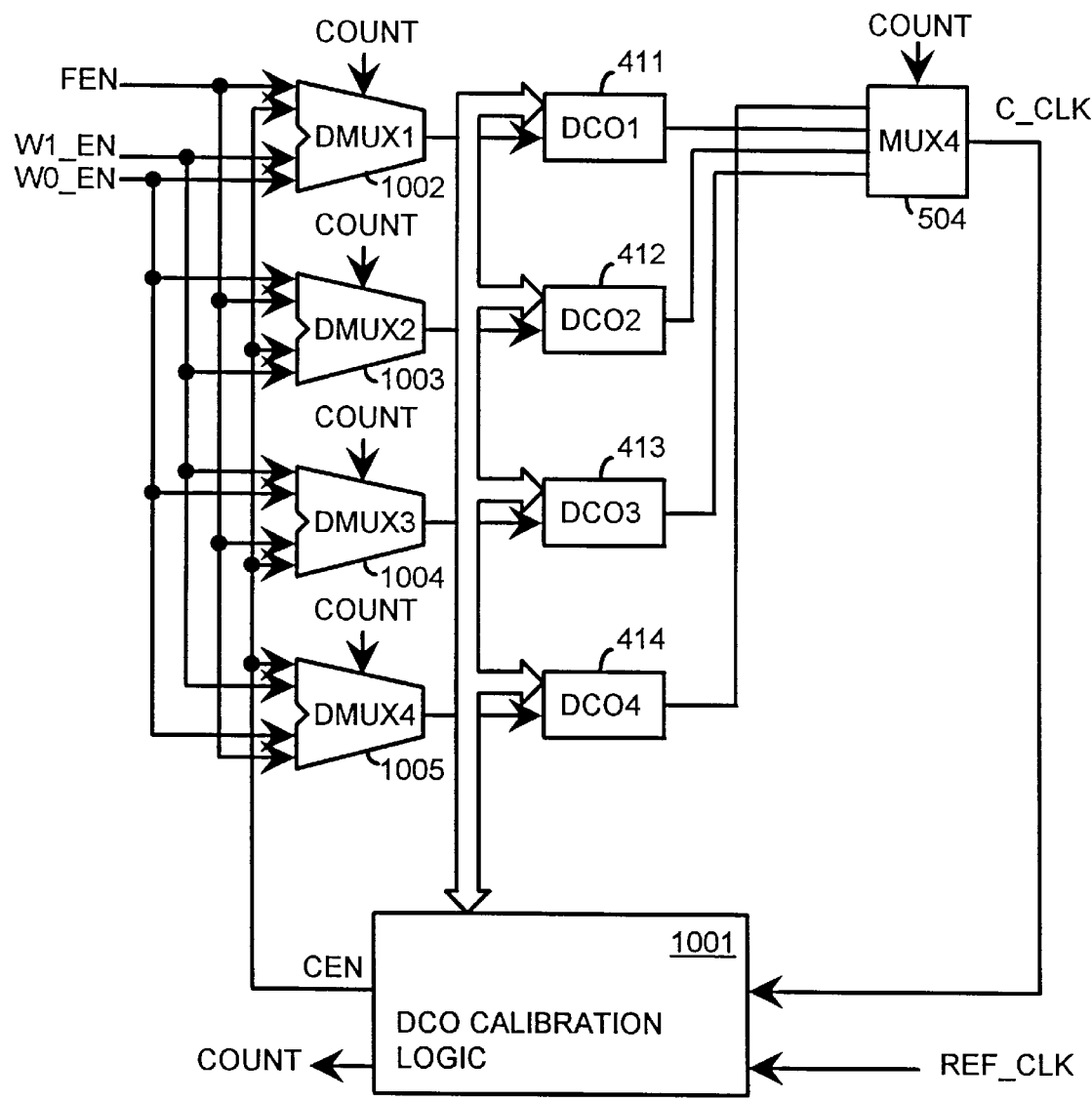
FIG. 10 illustrates, as an example, a block diagram of the DCO calibrator included in the PLL controller of FIG. 4, utilizing aspects of the present invention.
Figure 14:
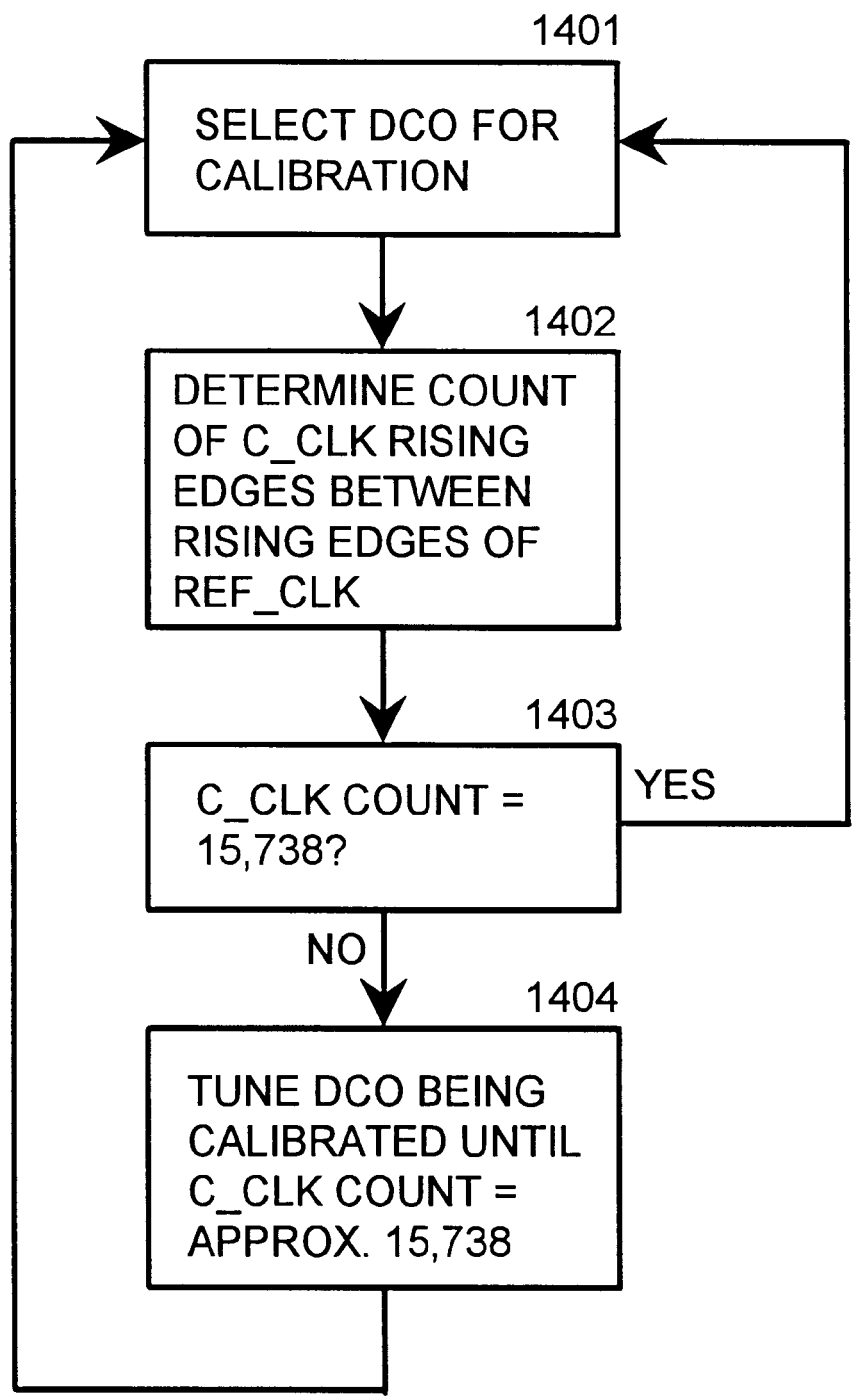
FIG. 14 illustrates, as an example, a flow diagram of a process utilizing aspects of the present invention for calibrating a plurality of DCOs one-at-a-time.

The DCO calibrator 407, as depicted in FIG. 10, includes DCO calibration logic 1001, which cooperates with the multiplexer 504 generating the calibration clock signal C_CLK, and four demultiplexer circuits 1002–1005 providing enable signals to the DCOs 411–414. The DCO calibration logic 1001 is preferably implemented as a state machine running with the clock signal F_CLK, and operates according to a process described in reference to FIG. 14. Referring to FIG. 14, in a first step 1401, the DCO calibration logic 1001 generates a 2 bit COUNT value provided to the multiplexer circuit 504 and each of the demultiplexer circuits 1002–1005, to select one of the four programmable DCOs 411–414 for calibration. In a second step 1402, the DCO calibration logic 1001 counts the number of rising edges on the clock signal C_CLK, between successive rising edges of the a reference clock signal REF_CLK. Since the reference clock signal REF_CLK is maintained at a frequency of ($1/128$) MHz, its clock period is always 128,000 nanoseconds. Further, since all of the DCO clock signals are desired to be maintained at a clock period of 8.133 nanoseconds, the count of rising edges on the clock signal C_CLK should be approximately 15,738 between rising edges of the reference clock signal REF_CLK. To synchronize the clock signal C_CLK to the reference clock signal REF_CLK, the DCO calibration logic 1001 generates an enable signal CEN which is provided through a selected one of the demultiplexers 1002–1005 to the DCO being calibrated, such that it enables the DCO being calibrated upon a rising edge of the reference clock signal REF_CLK. In a third step 1403, if the count of rising edges on the clock signal C_CLK is 15,738, then the 2 bit COUNT is changed so that the next one of the programmable DCOs 411–414 is calibrated. On the other hand, in a fourth step 1404, if the count of rising edges on the clock signal C_CLK is not equal to 15,738, then the DCO calibration logic 1001 adjusts a programmable parameter of the programmable DCO being calibrated (i.e., its programmable offset parameter), until the count of rising edges on the clock signal C_CLK is equal to 15,738. One technique for conducting such adjustment involves performing a binary search on an offset parameter of the programmable DCO being calibrated, until either the count of rising edges on the clock signal C_CLK is equal to 15,738, or the number of bits indicating the offset parameter have been each modified according to the binary search. Upon completion of the binary search, the 2 bit COUNT is changed so that the next one of the programmable DCOs 411–414 is calibrated, and steps 1401–1404 are repeated.

Figure 12:
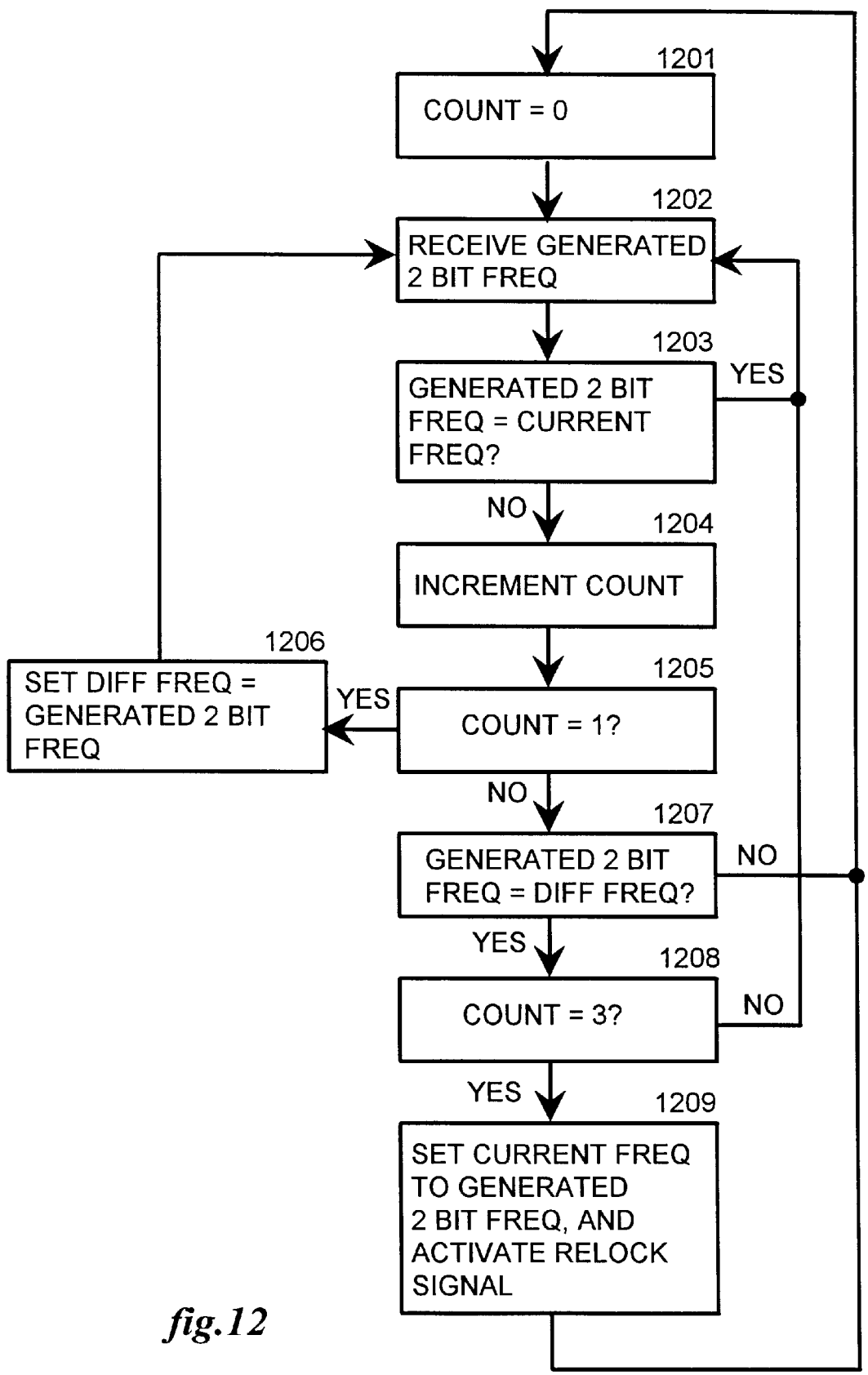
FIG. 12 illustrates, as an example, a flow diagram of a process utilizing aspects of the present invention for detecting a frequency change in the SPDIF audio data signal.

The frequency change detector 408 is preferably implemented as a state machine running with the clock signal F_CLK, and operates according to a process described in reference to FIG. 12. Referring to FIG. 12, in a first step 1201, the frequency change detector 408 initializes by setting a count to zero. In a second step 1202, the frequency change detector 408 receives the 2 bit FREQ generated by the frequency detector 403, and in a third step 1203, compares the received 2 bit FREQ with a 2 bit FREQ value stored, for example, in a current frequency register, wherein the stored 2 bit FREQ value corresponds to the last established frequency (FD) of the incoming audio data signal SPDIF. If the generated 2 bit FREQ equals the stored 2 bit FREQ, then a frequency change has not been detected, and steps 1202–1203 are repeated. On the other hand, if the generated 2 bit FREQ does not equal the stored 2 bit FREQ, then a frequency change has been detected, and in a fourth step 1204, the frequency change detector 408 increments the count initialized in step 1201. In a fifth step 1205, if the incremented count is equal to 1, then the frequency change detector 408 stores the received 2 bit FREQ in a different frequency register, and steps 1202–1205 are repeated. On the other hand, if the incremented count is greater than 1, then in a seventh step 1207, the frequency change detector 408 compares the received 2 bit FREQ against the frequency stored, in step 1206, in the different frequency register. If the received 2 bit FREQ does not equal the frequency stored in the different frequency register, then steps 1201–1207 are repeated. On the other hand, if the received 2 bit FREQ does equal the frequency stored in the different frequency register, then in an eighth step 1208, the frequency change detector 408 checks to see if the incremented count is equal to three. If the incremented count is not equal to three, then steps 1202–1208 are repeated. On the other hand, if the incremented count is equal to three (i.e., a different frequency other than that stored in the current frequency register has been detected three times in a row), then the frequency change detector 408 determines that a change in frequency has occurred, stores the received 2 bit FREQ in the current frequency register, and activates a RELOCK line (i.e., places the relock signal RELOCK in the relocking mode state) coupled to the PLL tuning logic 120 so that the PLL tuning logic 120 tunes the self-tuning phase-locked loop circuit 100 to the new frequency.

Figure 13:
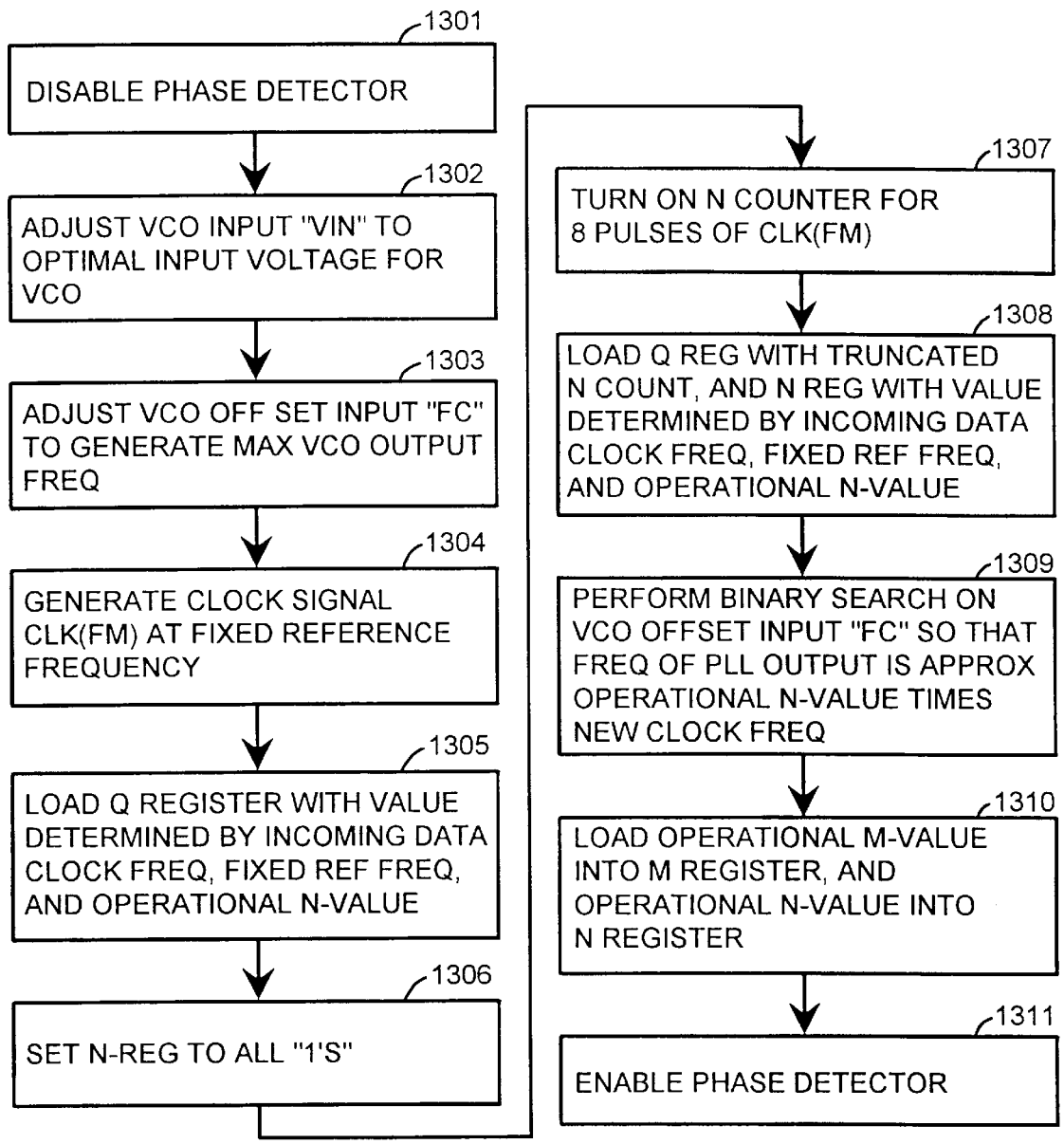
FIG. 13 illustrates, as an example, a flow diagram of a process utilizing aspects of the present invention for retuning the self-tuning PLL circuit of FIG. 1 to a new frequency.

The PLL tuning logic 120 is preferably implemented as a state machine running with the clock signal F_CLK, and operates according to a process described in reference to FIG. 13. Referring to FIG. 13, in a first step 1301, the PLL tuning logic 120 detects when the frequency change detector 408 activates the RELOCK line, and in response thereof, first disables the phase-frequency detector 102 before initiating a retuning of the self-tuning phase-locked loop circuit 100. It does this, for example, by overriding the phase-frequency detector enable signal PDE generated by the phase-frequency detector enable signal generator 406, which during normal data read mode operation, drives the phase-frequency enable line PFD_EN coupled to the phase-frequency detector 102.

In a second step 1302, the PLL tuning logic 120 causes the input voltage VIN to the programmable VCO 105 to be adjusted to an optimal input voltage such as one-half the supply voltage VCC (e.g., VCC/2). It does this, for example, by causing charge to be added or subtracted from the charge pump 103, so that the charge pump 103 in turn, adjusts the voltage on the node 122 to the optimal input voltage.

In a third step 1303, the PLL tuning logic 120 adjusts the programmable VCO offset input (i.e., contents of F-register 1051) to generate a maximum VCO output frequency (FI) with VIN at the optimal input voltage (e.g., VCC/2). Where the F-register is 7-bits wide and a bit pattern "0000000" stored therein causes the offset frequency (FC) to be a maximum value and a bit pattern "1111111" stored therein causes the offset frequency (FC) to be a minimum value, the PLL tuning logic 120 does this, for example, by providing the bit pattern "0000000" on data lines 121 while enabling the F-register enable line F_WR.

In a fourth step 1304, the PLL tuning logic 120 generates a tuning clock signal CLK(FM) at a fixed reference frequency of ($\frac{1}{128}$) MHz by providing the system clock signal SYS_CLK at the input of the divide-by-M circuit 101, causing selector 108 through select line M_SEL to pass the contents of the register coupled to data lines 111 to the M-register 1011, and storing the passed contents into the M-register 1011 by enabling the write line M_WR, wherein the register coupled to data lines 111 stores the number equal to a rounded-off product of the system clock frequency times 128 Mhz, as previously described.

In a fifth step 1305, the PLL tuning logic 120 either calculates a value to be stored in the Q-register 1061 of the divide-by-Q 106, or looks up the value in a look-up table (LUT) residing, for example, in the external memory. To calculate the value to be stored in the Q-register 1061, the following equation is used:

$$Q = N \times (FD \times 128) \qquad (3)$$

where,
  N=4 or 6, as examples, depending upon the sampling rate requirements of circuitry in the digital audio equipment;
  FD=the detected frequency (FD) in MHz; and
  128=the reciprocal of the tuning clock signal CLK(FM) frequency (FM) in MHz$^{-1}$.

The PLL tuning logic 120 thereupon causes the looked up value to be stored in the Q-register 1061 by causing selector 112 through select line Q_SEL to pass the data on the data lines 114 to the Q-register 1061, and storing the passed data into the Q-register 1061 by enabling the write line Q_WR, wherein the data lines 114 are coupled to the external memory containing the look-up table, and the PLL tuning logic 120 or other circuitry in the digital audio equipment have caused the value looked-up in the look-up table to have been provided on the data lines 114.

In a sixth step 1306, the PLL tuning logic 120 programs the N-counter 1072 of the divide-by-N 107 to count to its maximum value by activating a MAX signal line, for example, which in turn, effectively results in the N-counter 1072 functioning as if a bit pattern of all 1's had been loaded into the N-register 1071. As a result, the N-counter 1072 counts rising edges on the output clock signal CLK(F0) until either the N-counter 1072 is reset or the count reaches its maximum value as determined by the number of bits in the N-register 1071.

In a seventh step 1307, the PLL tuning logic 120 starts the N-counter 1072 counting, for example, by activating the reset line RSTN coupled to the divide-by-N 107 and enabling the current-controlled oscillator enable line CCOEN. The PLL tuning logic 120 receives the tuning clock signal CLK(FM). After eight rising edges of the tuning clock signal CLK(FM), the PLL tuning logic 120 stops the N-counter 1072, by disabling the current-controlled oscillator enable line CCOEN. The count of rising edges of the output clock signal CLK(F0) for eight periods or rising edges of the tuning clock signal CLK(FM) is then available on data lines 115 of the divide-by N 107.

In an eighth step 1308, the PLL tuning logic 120 loads a truncated version of the count of the N-counter 1072 into the Q-register 1061 of the divide-by-Q 106, and loads the value previously stored in the Q-register 1061 and corresponding to equation (3), into the N-register 1071. In particular, the new value to be stored in the Q-register 1061 is determined by truncating the count of the N-counter 1062 by three bits, which is equivalent to dividing the count by eight, thereby compensating for the eight periods of the tuning clock signal CLK(FM) used in determining the count. A simple way of implementing this, is to not couple the data lines corresponding to the three least-significant-bits of the count to the selector 112, and couple the remaining data lines to the selector 112, shifted accordingly. The PLL tuning logic 120 thereupon causes the truncated version of the count to be stored in the Q-register 1061 by causing selector 112 through select line Q_SEL to pass the data on the coupled data lines to the Q-register 1061, and storing the passed data into the Q-register 1061 by enabling the write line Q_WR. Since the value previously stored in the Q-register 1061 and corresponding to equation (3) is still residing on the data lines 114, the PLL tuning logic 120 loads this value into the N-register by simply enabling the write line N_WR.

In a ninth step 1309, the PLL tuning logic 120 then performs a binary search operation on the contents of the F-register 1051 of the programmable VCO 105, until either the count of the N-counter 1072 after eight pulses of the tuning clock signal CLK(FM) is equal to eight (i.e., the frequency (FN) of the clock signal CLK(FN) is equal to the frequency of the tuning clock signal CLK(FM)), or each of the bits of the F-register have been adjusted according to the binary search. As an example, of the binary search technique, the bit pattern "100000" is first loaded into the F-register 1051, and the CCO 1053 of the programmable VCO 105 is enabled for eight rising edges of the tuning clock signal CLK(FM) by enabling the enable line CCOEN for this period of time. If the count on the N-counter 1072 is more than eight, then the contents of the F-register are too high (i.e., the PLL output frequency is too high), and the bit pattern "010000" is next loaded into the F-register 1051, and the count of the N-counter 1072 checked again for eight rising edges of the tuning clock signal CLK(FM). On the other hand, if the count on the N-counter 1072 is less than eight, then the contents of the F-register are too low (i.e., the PLL output frequency is too low), and the bit pattern "110000" is next loaded into the F-register 1051, and the count of the N-counter 1072 checked again for eight rising edges of the tuning clock signal CLK(FM). Successive iterations then follow until either the count on the N-counter 1072 is equal to eight, or all of the bits of the F-register 1051 have been adjusted by the binary search operation. The PLL tuning logic 120 receives both the tuning clock signal CLK(FM) and the clock signal output CLK(FN) of the divide-by-N 107, and performs such above described count functions preferably with counters implemented in the state machine implementing the PLL tuning logic 120.

Finally, in tenth and eleventh steps, 1310 and 1311, the PLL tuning logic 120, having tuned the self-tuning phase-locked loop circuit 100 by adjusting the contents of the Q-register 1061 of the divide-by-Q 106 and the F-register 1051 of the programmable VCO 105, then restores the proper operational values into the N-register 1071 (e.g., 4 or 6) and the M-register 1011 (e.g., 1), provides the extracted clock signal XR_CLK as the input clock signal CLK(FD) to the divide-by-M 101, and synchronizes the output clock signal CLK(F0) with the input clock signal CLK(FD) by activating the enable line CCOEN of the programmable VCO 105 upon a rising edge of the input clock signal CLK(FD), after re-enabling the phase-frequency detector 102 by activating the phase-frequency detector enable line PFD_EN. At the same time, the PLL tuning logic 120 also generates the enable line FEN so that the F_CLK signal will also be synchronized with the extracted clock signal XR_CLK.

Figure 15:
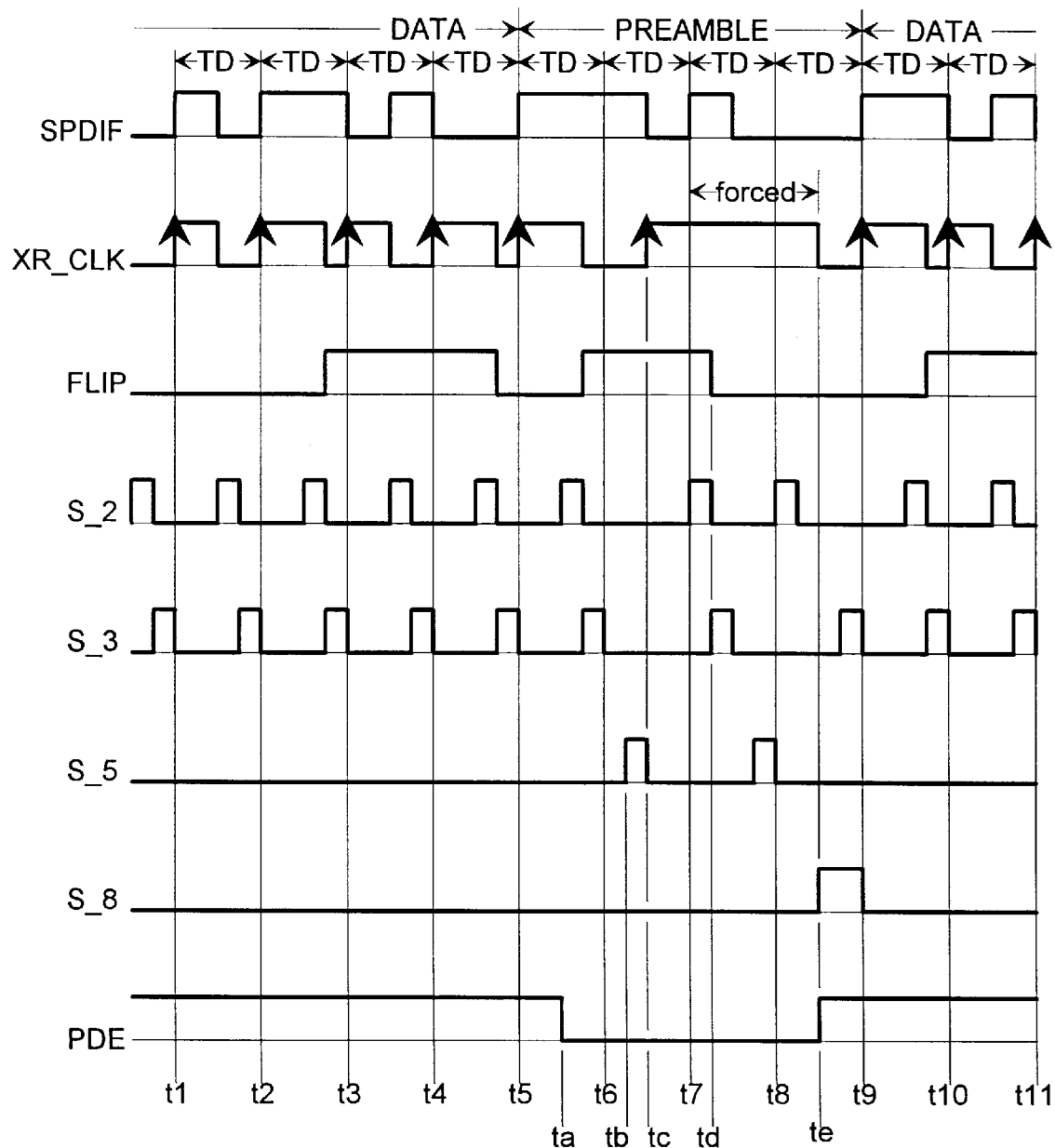
FIG. 15 illustrates, as examples, timing diagrams useful for describing the process of extracting a clock signal from the SPDIF audio data signal, and generating a phase-frequency detector enable signal during normal reading of data from the SPDIF audio data signal.

FIG. 15 illustrates, as examples, timing diagrams useful for describing the process of extracting a clock signal from the SPDIF audio data signal, and generating a phase-frequency detector enable signal PDE during normal mode operation (i.e., not during a PLL tuning period). The incoming audio data signal SPDIF is coded in biphase mark, and records of data individually comprise four periods TD of a synchronizing preamble followed by twenty-eight periods TD of data. In particular, the last four periods of data (time t1–t5) for a prior record, a preamble for a next record (time t5–t9), and the first two periods of data (time t9–t11) for the next record are illustrated in FIG. 15. In addition, examples of timing signals S_2, S_3, S_5, and S_8 are also illustrated, as well as a flip signal FLIP resulting at the Q-output of the D flip-flop 701 of the clock signal extractor 404, the extracted clock signal XR_CLK resulting at the output of the exclusive-OR 702 of the clock signal extractor 404, and the phase-frequency detector enable signal PDE resulting at the Q-output of the set-resettable D flip-flop 903 of the phase-frequency detector enable signal generator 406. Of special note is that during the period between t7 and te of the preamble, the output of the extracted clock signal XR_CLK is forced to resemble the waveform indicated, in order that the timing signal S_8 generates a rising edge at time td to indicate that the phase-frequency detector enable line PDE should be activated. This force period starts from the first rising edge of the timing signal S_2 after a rising edge of the timing signal S_5 indicates detection of a preamble, and ends after the first rising edge of the timing signal S_8 indicates the end of the detected preamble. During the force period, the FLIP signal is also forced LOW following a first rising edge of the timing signal S_3, by, for example, resetting the flip-flop 701.

Although the various aspects of the present invention have been described with respect to a preferred embodiment, it will be understood that the invention is entitled to full protection within the full scope of the appended claims.

What is claimed is:

1. A self-tuning phase-locked loop circuit comprising:

a divide-by-M circuit having an input and an output, said divide-by-M circuit input receiving an input clock signal having an input clock frequency;

a phase-frequency detector circuit having a first input, a second input, and an output, said phase-frequency detector circuit first input coupled to said divide-by-M circuit output;

a voltage-controlled oscillator circuit coupled to a power supply providing a supply voltage, said voltage-controlled oscillator circuit having a voltage input, at least one parameter adjusting input, and an output, said voltage input receiving an input voltage from a node switchably coupled to said phase-frequency detector circuit output, said at least one parameter adjusting input receiving at least one parameter adjusting value, and said voltage-controlled oscillator circuit output providing an output clock signal having an output clock frequency related to said input voltage and said at least one parameter adjusting value;

a divide-by-N circuit having an input and an output, said divide-by-N circuit input receiving said output clock signal, and said divide-by-N output coupled to said phase-frequency detector circuit second input; and a tuning circuit coupled to said phase-frequency detector circuit and said voltage-controlled oscillator circuit, said tuning circuit receiving a relock signal, and if said relock signal is in a relocking mode state, switchably decoupling said phase-frequency detector circuit output from said node, and adjusting said at least one parameter adjusting value such that said output clock frequency is approximately equal to said input clock frequency multiplied by a closed loop gain of the self-tuning phase-locked loop circuit when said input voltage is one-half the supply voltage.

2. The self-tuning phase-locked loop circuit as recited in claim 1, wherein said phase-frequency detector circuit includes an output control circuit coupled to said tuning circuit, said output control circuit enabling said phase-frequency detector circuit output to provide said input voltage to said voltage-controlled oscillator voltage input when said relock signal is not in said relocking mode by coupling said phase-frequency detector circuit output to said node, and disabling said phase-frequency detector circuit output from providing said input voltage to said voltage-controlled oscillator voltage input when said relock signal is in said relocking mode by decoupling said phase-frequency detector circuit output from said node.

3. The self-tuning phase-locked loop circuit as recited in claim 2, further comprising an input voltage adjusting circuit coupled to said tuning circuit and said node, wherein said tuning circuit causes that input voltage adjusting circuit to adjust the voltage on said node to approximately one-half the supply voltage when said relock signal is in said relocking mode.

4. The self-tuning phase-locked loop circuit as recited in claim 3, wherein said at least one parameter adjusting input includes a frequency offset input and a gain adjustment input, and said voltage-controlled oscillator circuit comprises:

means for storing a programmable frequency offset value received through said frequency offset input;

a voltage-to-current converter circuit having an input and an output, said voltage-to-current converter circuit input receiving said input voltage, and said voltage-to-current converter circuit output providing a current;

a current-controlled oscillator circuit having an input and an output, said current-controlled oscillator circuit input receiving said voltage-to-current converter circuit output current, and said current-controlled oscillator circuit output providing an interim clock signal having an interim frequency related to said programmable frequency offset value and said voltage-to-current converter circuit output current; and a divide-by-Q circuit including means for storing a divisor value received through said gain adjustment input, said divide-by-Q circuit having an input and an output, said divide-by-Q circuit input receiving said interim clock signal, and said divide-by-Q circuit output providing said output clock signal having said output frequency related to said input voltage and said at least one parameter adjustable value, and approximately equal to said interim frequency divided by said divisor value stored in said storing means of said divide-by-Q circuit.

5. A self-tuning clock recovery phase-locked loop circuit coupled to a supply voltage, comprising:

a divide-by-M circuit having an input for receiving a reference clock signal, and an output;

a phase-frequency detector circuit having a first input, a second input, and an output, wherein said first input is coupled to said divide-by-M circuit output;

a voltage-controlled oscillator having a voltage input, a programmable offset input, and an output, wherein said voltage input is switchably coupled to said phase-frequency detector circuit output, and said voltage-controlled oscillator output has a frequency responsive to said voltage input and said programmable offset input;

a divide-by-N circuit having an input and an output, said input coupled to said voltage-controlled oscillator output, and said output coupled to said phase-frequency detector second input;

means for determining a clock frequency from an incoming data stream; and means for adjusting said voltage-controlled oscillator programmable offset input so that said voltage-controlled oscillator is approximately equal to the determined clock frequency multiplied by a closed loop gain of the phase-locked loop circuit when said voltage-controlled oscillator voltage input is equal to an optimal input voltage for said voltage-controlled oscillator.

6. The self-tuning clock recovery phase-locked loop circuit as recited in claim 5, wherein said optimal input voltage is approximately one-half the voltage of the supply voltage coupled to said self-tuning clock recovery phase-locked loop circuit.

7. A method of tuning a phase-locked loop circuit to recover a clock signal from an incoming data stream, said phase-locked loop circuit including a voltage-controlled oscillator having a voltage input, at least one adjustable parameter, and an output having a frequency responsive to said voltage input and said at least one adjustable parameter, the method comprising the steps of:

determining a clock frequency of the incoming data stream; and adjusting said voltage-controlled oscillator at least one adjustable parameter so that said voltage-controlled oscillator output frequency is approximately equal to said determined clock frequency multiplied by a closed loop gain of the phase-locked loop circuit when said voltage-controlled oscillator voltage input is at an optimal input voltage providing optimal linearity and dynamic range for said voltage-controlled oscillator.

8. The method as recited in claim 7, wherein said clock frequency determining step comprises the step of determining the clock frequency of the incoming data stream from the incoming data stream.

9. The method as recited in claim 8, wherein said clock frequency determining step comprises the step of determining the clock frequency from the incoming data stream by identifying a portion of the incoming data stream which is constant valued for a known period of time.

10. The method as recited in claim 7, further comprising before said voltage-controlled oscillator at least one adjustable parameter adjusting step, the step of extracting a data stream clock signal from the incoming data stream.

11. The method as recited in claim 10, wherein said at least one adjustable parameter includes an offset parameter, said phase-locked loop circuit further includes a phase-frequency detector and means for coupling and decoupling an output of said phase-frequency detector to and from said voltage-controlled oscillator voltage input, and said voltage-controlled oscillator at least one adjustable parameter adjusting step comprises the steps of:

causing said coupling and decoupling means to decouple said phase-frequency detector output from said voltage-controlled oscillator voltage input;

adjusting said voltage-controlled oscillator voltage input to substantially said optimal input voltage;

adjusting said offset parameter until said voltage-controlled oscillator frequency output is substantially equal to the determined clock frequency from the incoming data stream multiplied by the closed loop gain of the phase-locked loop circuit;

providing said data stream clock signal extracted from the incoming data stream to an input of the phase-locked loop circuit; and causing said coupling and decoupling means to couple said phase-frequency detector output to said voltage-controlled oscillator voltage input after synchronizing said voltage-controlled oscillator output with said data stream clock signal provided to said input of the phase-locked loop circuit, thereby generating said recovered clock signal as said voltage-controlled oscillator output.

12. A method of re-tuning a phase-locked loop circuit to recover a clock signal from an incoming data stream after a frequency of the incoming data stream changes, said phase-locked loop circuit including a voltage-controlled oscillator having a voltage input, at least one adjustable parameter, and an output having a frequency responsive to said voltage input and said at least one adjustable parameter, the method comprising the steps of:

monitoring the incoming data stream to detect a change in the incoming data stream frequency and determine a new frequency from the incoming data stream after said change in frequency; and adjusting said voltage-controlled oscillator at least one adjustable parameter so that said voltage-controlled oscillator output frequency is approximately equal to said determined new frequency multiplied by a closed loop gain of the phase-locked loop circuit when said voltage-controlled oscillator voltage input is at an optimal input voltage providing optimal linearity and dynamic range for said voltage-controlled oscillator.

13. The method as recited in claim 12, wherein said monitoring step comprises the step of detecting the change in the incoming data stream by periodically determining a frequency from the incoming data stream, and comparing the periodically determined frequency against at least one threshold frequency value.

14. The method as recited in claim 13, wherein said incoming data stream frequency determining step comprises the steps of:

identifying a portion of the incoming data stream which is constant valued for a known period of time;

generating a fixed clock signal having a frequency greater than the incoming data stream frequency; and counting the number of periods of said fixed clock signal during said known period of time.

15. A method of generating a fixed frequency clock signal from a plurality of voltage-controlled oscillators and a system clock signal of known arbitrary frequency, comprising the steps of:

programming a divide-by-S circuit such that the frequency divisor is approximately equal to said known arbitrary frequency multiplied by a preselected factor;

generating a reference clock signal having a frequency substantially proportional to a reciprocal of said preselected factor by providing said system clock signal to an input of said divide-by-S circuit;

sequentially calibrating one-at-a-time said plurality of voltage-controlled oscillators with said reference clock signal; and generating said fixed frequency clock signal alternatingly from selected ones, which are not being calibrated at the time, of said plurality of voltage-controlled oscillators.

* * * * *